United States Patent
Graf et al.

(10) Patent No.: US 7,554,432 B2
(45) Date of Patent: Jun. 30, 2009

(54) FUSE ELEMENT WITH TRIGGER ASSISTANCE

(75) Inventors: Alfons Graf, Kaufering (DE); Martin Maerz, Nuremberg (DE); Martin Saliternig, Herzogenaurach (DE)

(73) Assignee: Infineon Technologies AG, Munich (DE)

( * ) Notice: Subject to any disclaimer, the term of this patent is extended or adjusted under 35 U.S.C. 154(b) by 306 days.

(21) Appl. No.: 11/420,280

(22) Filed: May 25, 2006

(65) Prior Publication Data

US 2006/0267721 A1  Nov. 30, 2006

(30) Foreign Application Priority Data

May 27, 2005  (DE) .................... 10 2005 024 346

(51) Int. Cl.
*H01H 85/04* (2006.01)
*H01H 85/12* (2006.01)
*H01L 23/495* (2006.01)

(52) U.S. Cl. .............. 337/296; 337/290; 337/297; 337/159; 337/416; 361/104

(58) Field of Classification Search ............. 337/159, 337/297, 290, 296, 416; 29/623; 361/104
See application file for complete search history.

(56) References Cited

U.S. PATENT DOCUMENTS

| | | | | |
|---|---|---|---|---|
| 4,494,104 A * | 1/1985 | Holmes | ............. | 337/403 |
| 4,677,412 A * | 6/1987 | Sibalis | ............. | 337/401 |
| 4,771,260 A * | 9/1988 | Gurevich | ............. | 337/231 |
| 4,873,506 A * | 10/1989 | Gurevich | ............. | 337/290 |
| 4,924,203 A * | 5/1990 | Gurevich | ............. | 337/231 |
| 5,097,247 A * | 3/1992 | Doerrwaechter | ......... | 337/405 |
| 5,682,057 A | 10/1997 | Kuriyama | ............. | 257/529 |
| 5,712,610 A * | 1/1998 | Takeichi et al. | ......... | 337/290 |
| 5,777,540 A * | 7/1998 | Dedert et al. | ........... | 337/142 |
| 5,784,248 A | 7/1998 | Tomiyasu et al. | ....... | 361/523 |
| 5,793,275 A * | 8/1998 | Iversen | ............... | 337/273 |
| 5,982,268 A * | 11/1999 | Kawanishi | ........... | 337/297 |
| 6,094,128 A | 7/2000 | Bennett et al. | .......... | 338/21 |
| 6,452,475 B1 * | 9/2002 | Kawazu et al. | .......... | 337/290 |
| 6,504,467 B1 | 1/2003 | Berberich et al. | ....... | 337/139 |
| 7,042,327 B2 * | 5/2006 | Tanaka et al. | ........... | 337/290 |
| 2002/0113685 A1* | 8/2002 | Izaki et al. | .............. | 337/405 |
| 2003/0169143 A1* | 9/2003 | Tanaka | ................. | 337/159 |
| 2004/0264092 A1 | 12/2004 | Grunbichler et al. | ..... | 361/103 |
| 2005/0001710 A1 | 1/2005 | Mukai et al. | ............. | 337/297 |

(Continued)

FOREIGN PATENT DOCUMENTS

DE  7809564 U1  8/1978

(Continued)

OTHER PUBLICATIONS

Von R.J. Klein Wassink, "Soft Soldering in Electronics", Eugen G. Leuze Verlad, pp. 211 and 212 (Jul. 16, 1992).

*Primary Examiner*—Anatoly Vortman
(74) *Attorney, Agent, or Firm*—Eschweiler & Associates, LLC (57) ABSTRACT

A fuse is provided in a circuit, such that the fuse and an electric device in the circuit are thermally coupled to one another. The generation of the amount of heat by the electric device causes a fusible material in the fuse to melt. In this manner, the current terminal path of the electric device is interrupted.

20 Claims, 7 Drawing Sheets

U.S. PATENT DOCUMENTS

| | | | |
|---|---|---|---|
| 2005/0007234 A1* | 1/2005 | Wada et al. | 337/405 |
| 2005/0264394 A1* | 12/2005 | Furuuchi | 337/182 |
| 2006/0102385 A1 | 5/2006 | Heise et al. | 174/257 |

FOREIGN PATENT DOCUMENTS

| | | |
|---|---|---|
| DE | 3610886 | 10/1987 |
| DE | 19714544 A1 | 10/1997 |
| DE | 10334433 A1 | 3/2005 |
| DE | 102004025420 A1 | 12/2005 |
| EP | 0510900 A2 | 4/1992 |
| EP | 1079674 A1 | 2/2001 |
| GB | 2205455 | 12/1988 |
| JP | 1004053 A | 1/1989 |
| JP | 04237139 A | 8/1992 |
| JP | 05258653 A * | 10/1993 |
| JP | 11213852 A | 8/1999 |
| JP | 2000-323308 A | 11/2000 |
| JP | 2000323308 A | 11/2000 |
| JP | 2003288827 A | 10/2003 |
| WO | 03/017292 A2 | 2/2003 |
| WO | 2004/002202 A1 | 12/2003 |

* cited by examiner

FIG 1

Prior Art

FIG 2

Prior Art

FIG 3

Prior Art

FIG 4

Prior Art

FIG 5

Prior Art

Prior Art

FIG 21

Prior Art

FUSE ELEMENT WITH TRIGGER ASSISTANCE

CROSS-REFERENCE TO RELATED APPLICATIONS

This application claims priority from German Patent Application No. 102005024346.0, which was filed on May 27, 2005, and is incorporated herein by reference in its entirety.

TECHNICAL FIELD

The present invention relates to a fuse element having a trigger assistance as may be used, for example, for protecting electronic components on circuit boards populated with electronic components.

BACKGROUND

A task which is becoming increasingly important in electronics, particularly with regard to security aspects, is to find out how individual devices or circuit parts may be put out of operation permanently and as inexpensively as possible in the event of failure so as to prevent major consequential damage. For example, power semiconductors are nowadays used to a large extent for switching electrical loads such as lamps, valves, engines, heating elements etc., but, additionally, they are increasingly used in the area of performance management for switching off individual circuit parts, for example to reduce the energy consumption of battery-powered apparatuses.

Figure 20:
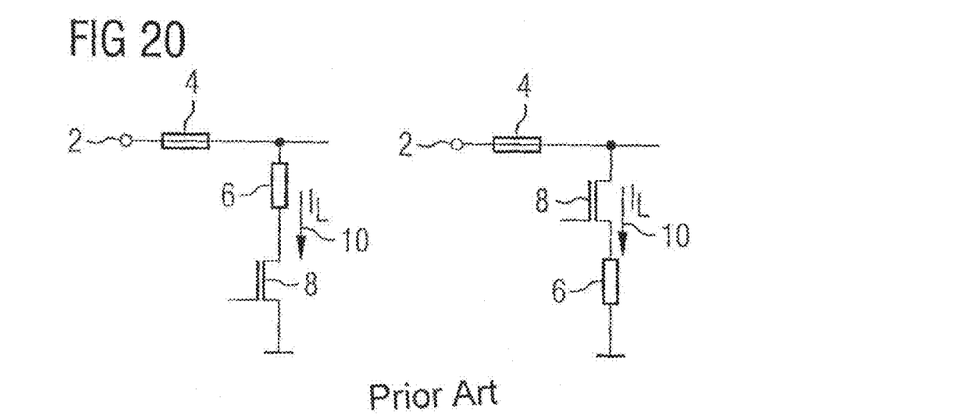
FIG. 20 shows a circuit of a power switch in high-side and low-side configurations.

The two typical arrangements of a switch and a current consumer are depicted in FIG. 20. FIG. 20 shows a supply voltage terminal 2, a blow-out fuse 4, a current-consuming load 6, and a power switch 8. Blow-out fuse 4, load 6 and power switch 8 are connected in series, along a current flow direction 10, between supply voltage terminal 2 and ground. Depending on whether the power switch 8 along current flow direction 10 is located closer to supply voltage terminal 2 than is load 6, one speaks of a high-side or a low-side switch, a high-side switch implying that the power switch 8 along current flow direction 10 is arranged closer to supply voltage terminal 2 than is load 6. In order that only little power dissipation be generated in power switch 8, it is important for power switch 8 to exhibit, in the ON state, a very much smaller electrical resistance than load 6. For low-voltage applications, power MOSFETs have been widely accepted as electronic switches. The development towards increasingly low specific forward resistances (RDS(on)×A), which has been very fast in the last few years, has enabled the fact that nowadays currents having a high number of amperes are controllable using semiconductor switches mounted directly on a circuit board, and without using any specific cooling measures.

Figure 21:
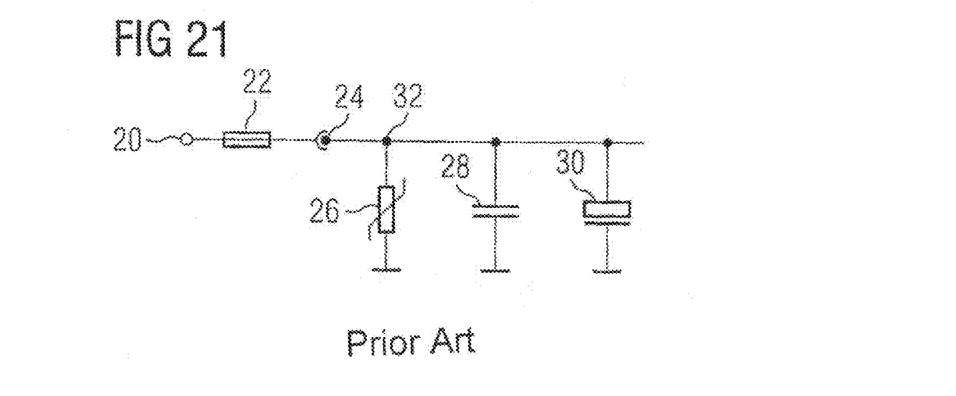
FIG. 21 shows a circuit of security-critical components directly connected to a supply voltage.

A further important problem area includes devices which are critical in terms of security and are located directly at the supply voltage. These include all devices which are very likely to exhibit low resistance at the end of their useful lives, when overloaded or in the event of premature failure. In particular, this relates to varistors, multi-layer ceramic capacitors (MLCC) and tantalum electrolytic capacitors as are depicted in FIG. 21. FIG. 21 shows a selection of such security-critical devices which are protected, or fused, by a common blow-out fuse. What is shown are a supply voltage terminal 20, a blow-out fuse 22, a plug-type connection, or cable terminal, 24, a varistor 26, a multi-layer ceramic capacitor 28, and a tantalum electrolytic capacitor 30. Blow-out fuse 22 and plug-type connection 24 are connected in series between the supply voltage terminal 20 and a circuit node 32. Varistor 26, multi-layer ceramic capacitor 28, and tantalum electrolytic capacitor 30 are connected in parallel between circuit node 32 and ground. In the operative state, multi-layer ceramic capacitor 28, tantalum electrolytic capacitor 30 and varistor 26 exhibit a negligible leakage current in the entire admissible operating voltage range and operating temperature range, and thus exhibit negligible static power dissipation. If, however, the leakage current increases in the event of a failure, or if a short-circuit occurs between plates, specifically in multi-layer ceramic capacitors—e.g. due to a breakage caused by mechanical stress—static power dissipation increases to a very high extent and may lead to extreme overheating of a device, since now a large current flow through the device becomes possible without the fuse 22 triggering. What is also critical in terms of security in this respect are any plug-type connections or cable terminals 24 located in the circuit, if these elements, which normally exhibit very low resistance, exhibit a higher resistance or a leakage current—e.g. due to contamination or aging—so that the power dissipation and thus the temperature at these components may increase way beyond the admissible degree.

The problem of a sharp local increase in the operating temperature also arises for a power switch as is shown in FIG. 20. A problem arises when, due to defects in the semiconductor switch or in its control, full switching on or off no longer occurs or is no longer possible. The switch then reaches neither its low nominal forward resistance nor its high-resistance OFF state. Consequently, power dissipation in the switch rises very sharply. In the worst case of the power matching, i.e. when the forward resistance of the switch reaches the range of the value of the load resistance, power dissipation may increase up to a quarter of the nominal power of the load—with non-linear loads such as incandescent lamps, to even higher values. This shall be illustrated below by means of an example. In a power MOSFET having a forward resistance of 10 mΩ, which is used as a switch for a load of 120 W at 12 V, power dissipation of 1 W arises during operation at normal rating. It is to this level of power dissipation that one will adapt the cooling of the MOSFET in a concrete circuit. However, if—due to a failure (e.g. in controlling)—the forward resistance increases, power dissipation in the switch may go up to values of up to 30 W if, in the event of failure, the forward resistance of the power MOSFET has the same magnitude as the ohmic resistance of the load. With a cooling adapted to 1 W, this very quickly leads to dangerously high temperatures or even to a fire hazard with regard to, e.g., the circuit board.

To provide protection against damage caused by exceedingly high currents, current-triggering blow-out fuses are primarily used, these being available in most varied designs and trigger characteristics. Common current-triggering blow-out fuses cannot absorb the occurrence of a defect of a power switch 8 as has been described above, since, as is known, no over-current whatsoever occurs in the circuit of FIG. 20. Load 6 always limits the current to a value which does not exceed the nominal operating current, so that the power dissipation arising at blow-out fuse 4 is too low to cause the material of the blow-out fuse to melt, and to break the circuit. With larger, centrally protected assemblies such as are represented, for example, in FIG. 21, there is the problem that the current which arises, in the event of a failure, at, e.g., the multi-layer ceramic capacitor 28 suffices, on the one hand, to locally generate extreme over-temperature at the multi-layer capacitor 28, but, on the other hand, the current does not reach a value high enough to trigger a centrally arranged blow-out fuse 22. In addition to the blow-out fuses, positive temperature coefficient resistors (PTCs) on a ceramic or polymer basis (e.g. Poly-Switch™) are widely used as an over-current protection. If no over-current occurs, however, as in the event of failure described above, these fuses, too, are not suitable as protection elements. Due to the size, the high cost and particularly the triggering characteristics, for many security-critical devices, PTCs are not suitable protections.

In capacitors, the operating alternating current (ripple current) may clearly exceed the triggering direct current to be called for; in this case, protection with a PTC element and a classic blow-out fuse is, in principle, not possible. PTC elements placed in very close proximity to the component to be protected would, in principle, achieve the task of interrupting a current flow in the event of a very sharp local temperature increase, but for most applications, these elements are not low-resistant enough, or too expensive.

A temperature switch (e.g. a bimetal switch) may also be used as a protection from overheating, but these switches are too bulky to be used on modern SMD-populated assemblies, and too expensive for protecting each individual security-critical component. Wired thermal fuses are utilized, e.g., in coffee machines or irons. With the wired thermal fuses, two current contacts which are mounted with prestress are released from their prestressed position by melting a fuse material, the contacts being spatially separated from one another due to the contacts being unstressed. Due to this construction principle, the wired thermal fuses are too bulky to be used on modern assemblies.

For protecting circuits from over-temperature, temperature sensors are additionally used, it not being possible to achieve a protective function by means of this type of monitoring for above-described failure scenarios of a security-critical device. Merely recognizing over-temperature at a semiconductor switch which is no longer controllable is of no use, since the current flow can no longer be interrupted by intervening in the control voltage of the defective switch.

A further possibility of monitoring circuits is to use a crowbar switch, a crowbar switch being understood to mean an efficient short-circuiting switch capable of triggering an existing central fuse in that it short-circuits a current path to ground, and thus creates a current flow in the circuit which is sufficiently high to cause a blow-out fuse to melt. Due to the high cost and the large amount of space required, crowbar solutions are not suitable for decentralized protective measures, where a multitude of security-critical devices are to be protected individually. A centrally mounted crowbar switch, however, restricts the potential areas of application to a very large extent, since in many applications it is not tolerable, in the event of failure, to put the entire system out of operation rather than only, e.g., one single load current path.

SUMMARY

A fuse element for protecting a current consumer may comprise a first terminal point, a second terminal point, and a fusible material, which melts at a predetermined temperature, between the first and the second terminal points, which is configured to establish, in the non-molten state, an electrically conductive connection between the first and the second terminal points; and an assistor between the first and the second terminal points, configured to assist in removing the fusible material in the molten state from an area between the first and the second terminal points.

BRIEF DESCRIPTION OF THE DRAWINGS

These and other objects and features of the present invention will become clear from the following description taken in conjunction with the accompanying drawing, in which.

DETAILED DESCRIPTION

A current consumer which, in the event of a malfunction, generates a predetermined amount of heat and/or creates an over-current, may be disconnected, in the event of a malfunction, from the current in a fast and reliable manner if a fuse element is used wherein a conducting connection between first and second terminal points is interrupted, by a material which melts at a predetermined temperature, and if the fuse element additionally contains an assistance means assisting in removing the molten material between the first and second terminal points.

In one embodiment, the nature of the fuse is such that a flux, which accelerates the flowing-off of the molten material from the area of the fuse, and thus accelerates the triggering of the fuse, is located within the melting material of the fuse or as a coating of same. In an configuration, the melting material of the fuse is completely surrounded by a shell of flux so that the shell additionally serves as an oxidation protection and protects the melting material against oxidation, so that the functionality of the fuse is ensured over long periods of time.

In a further embodiment, the triggering of the fuse is assisted in that the melting material is removed in an accelerated manner by exerting an additional force on the melting material, and in that the fuse thereby may trigger fast and reliably. The force can be dimensioned such that the non-molten material is not removed, but that at the beginning of the melting process, the triggering is assisted such that the fuse triggers fast and completely.

Assisting the triggering of a fuse may also be advantageous in the case of a current-triggering blow-out fuse, but the triggering assistance may constitute a major advantage particularly for the above-described temperature triggering of a fuse. In the event of a malfunction of a component, the temperature will generally not rise as much, at the location of the fuse, as is the case with an increase of a defect-induced fault current. Thus, the melting of the material will be observable over comparatively large time-scales. In order to prevent any high over-temperatures from occurring locally at the position of the component to be protected while the fuse has not triggered, it may be particularly advantageous to bring about complete triggering of the fuse by exerting an additional assisting force as soon as the fuse material starts to melt.

To this end, in an embodiment, an additional force is exerted on the melting material of the fuse by means of bulging materials, and/or the removal of the material is highly accelerated by setting off an explosive. In addition to gravitation and surface tension, the removal of the fuse material is thus accelerated by further external forces which may additionally be adapted to the desired triggering characteristic by means of a suitable choice of the geometries and of the materials used, which highly extends the possibilities of protection.

In a further preferred embodiment, the fuse element is configured as an SMD component together with the apparatus for assisting the triggering of the fuse, which may make it possible, by means of standard SMT production processes, and thus by utilizing existing processes and production plants, to protect security-critical components on a circuit carrier even against over-temperature in an individual and low-cost manner.

In a further embodiment, the melting material of the fuse is mounted on a carrier material, the carrier material having the property, at the location of the melting material, of repelling the melting material. Thus, the disconnection of the fuse is assisted, since, due to the repellant property of the carrier material, the molten material of the fuse is removed from the current-carrying area after it has melted. This embodiment allows particularly low-cost designs, wherein, e.g., the repellant material layer is deposited directly onto a printed circuit board (PCB) during manufacturing of same.

In a further embodiment, the melting material of the fuse is mounted on a carrier material, the carrier material exhibiting a gap or a depression at the location of the melting material. The volume which is released within the carrier allows, on the one hand, that the molten material may flow off completely from the current-carrying area into the volume, so that a completely disconnected fuse path results, and, on the other hand, the disconnection of the fuse is additionally assisted by capillary forces in that a capillary force acts on the molten material of the fuse in addition to gravity and surface tension.

In accordance with an embodiment, a switch and/or a current consumer and the fuse are arranged on a common circuit carrier such that the fuse and the switch are thermally coupled to one another, i.e. that the thermal energy generated at the switch is transferred onto the fuse by thermal conduction. The triggering of the fuse is effected in that a suitable material melts, it being ensured that the molten material flows off or is removed from the electrically conducting area of the fuse, so that the current supply to the switch is interrupted by the fuse in this manner. Due to the thus selected arrangement of the fuse and the switch, the triggering of the fuse is dependent on the thermal energy generated at the switch rather than on the power dissipation generated at the fuse element, and/or rather than on the current flowing through, as is the case in conventional blow-out fuses.

This results in a multitude of new areas of application in comparison with using a conventional blow-out fuse, and, additionally, it is also possible to freely determine, within wide limits, the temperature at which the fuse is to trigger by adequately selecting the material of the fuse. This may be exploited in order to optimize the system, consisting of fuse and electrical consumer, with a view to the purpose of protection desired. Due to the fact that the thermal energy which causes the material of the fuse to melt is not generated by the power dissipation arising at the fuse itself, the material to be selected as the melting material of the fuse may be one having a clearly lower electrical resistance than is the case with conventional blow-out fuses. When a critical temperature, the triggering temperature, is exceeded, the fuse independently and irreversibly interrupts the current path without requiring any assistance means such as a crowbar switch or a temperature sensor.

A fuse element located in the electric circuit may be produced at low cost in large batches, the fuse may need only a small amount of space on the electric circuit, so that electric circuits wherein a multitude of security-critical components may be individually protected are enabled. Unlike a central protection by means of a blow-out fuse, it is therefore possible to design circuits whose functionality is partly maintained in the event of a failure of an individual security-critical component, and which therefore may enable emergency operation.

In a further embodiment, the current consumer and the fuse are mounted on a common circuit carrier such as a circuit board, the fuse and the current consumer being connected to each other in an electrically conducting manner by a conductor line, and the conductor line being interrupted at a location where the interruption is bridged by the fuse in an electrically conducting manner. The melting material of the fuse is deposited as a layer onto the circuit board immediately during manufacturing of the circuit board, for example by means of a pressure process, so that a multitude of fuses may be mounted on the circuit board in a low-cost and efficient manner during the manufacturing of the circuit board.

In a further embodiment, the electric circuit is combined with the current consumer and the fuse within a package, so that the electric circuit is embodied as an individual discrete component. The component to be protected, such as a capacitor, is arranged within the package, the package comprising one or several terminal pins for connecting with a circuit board. The current-carrying terminal pin(s) is/are made from the melting material of the fuse. The components to be protected already include the fuse itself, so that no additional steps are required during the design or population phases. A chip located within a package which may be mounted on a circuit board may be protected in the same manner. The chip located in a package made from insulating material is connected to contact points located on the circuit board by means of the contacts of a lead frame. If, during the production of the lead frame, that terminal pin of the lead frame which forms the current supply terminal of the chip is manufactured from the melting material of the fuse, the chip may be protected against malfunction and overheating in a simple manner.

By constructing only one lead frame, several types of chips offered in the same package form may be protected against overheating, and that moreover, this protection results in no additional workload in populating a circuit board.

Different embodiments will be explained below with reference to the protection of power switches and security-critical components as are depicted in FIG. 20 and FIG. 21, a repeated explanation of FIGS. 20 and 21 being dispensed with below, and reference being made to FIGS. 20 and 21 in the relevant places.

Figure 1:
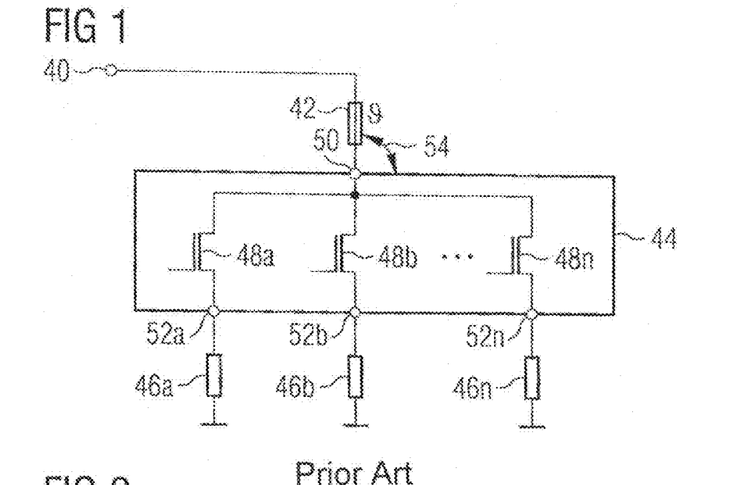
FIG. 1 shows a circuit for simultaneously protecting several consumers in high-side configuration.

FIG. 1 shows an electric circuit with a fuse element and a semiconductor switch in high-side configuration. What is shown are a supply voltage terminal 40, a fuse 42, a semiconductor switch 44, and a plurality of electrical loads 46a-46n. Semiconductor switch 44 includes a plurality of individual power switches 48a-48n, and in addition to control, diagnosis and ground terminals which are not represented here for clarity reasons, it exhibits a supply-side voltage terminal 50 and several load-side terminals 52a-52n. Fuse 42 is connected between supply voltage terminal 40 and voltage terminal 50 of semiconductor switch 44. Power switches 48a-48n within semiconductor switch 44 are connected between supply-side voltage terminal 50 and load-side voltage terminals 52a-52n, the electrical loads 46a-46n being connected between low-side voltage terminals 52a-52n and ground. Fuse 42 is thermally coupled to semiconductor switch 44 via a thermally conductive connection 52. If, in the event of a failure, the semiconductor switch 44 heats to dangerously high temperatures, fuse 42 melts and interrupts the current flow. When fuse 42 and/or the fuse element are arranged in the common current supply voltage-side current path, fuse 42 simultaneously disconnects all channels of defective semiconductor switch 44 from supply voltage 40.

Figure 2:
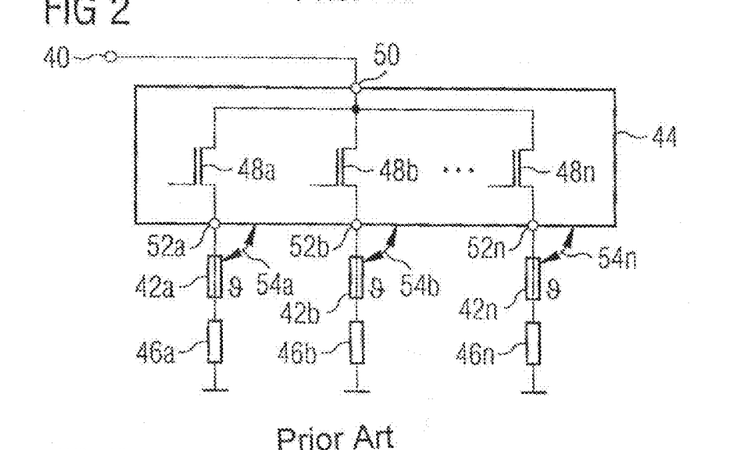
FIG. 2 shows a circuit for individually protecting several consumers in high-side configuration.
Figure 3:
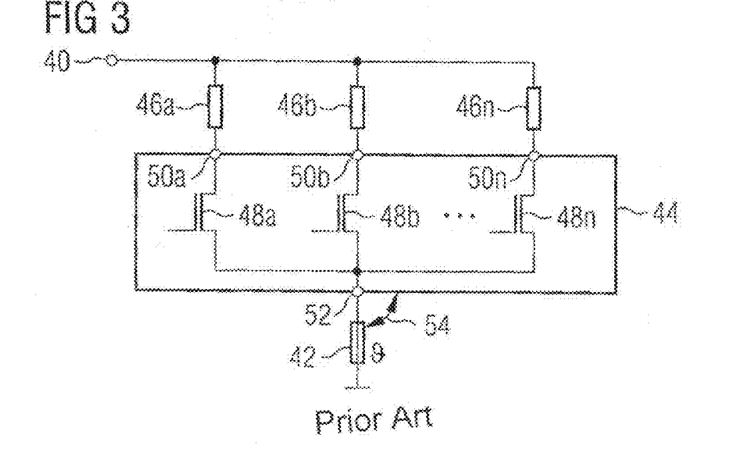
FIG. 3 shows a circuit for jointly protecting several consumers in low-side configuration.
Figure 4:
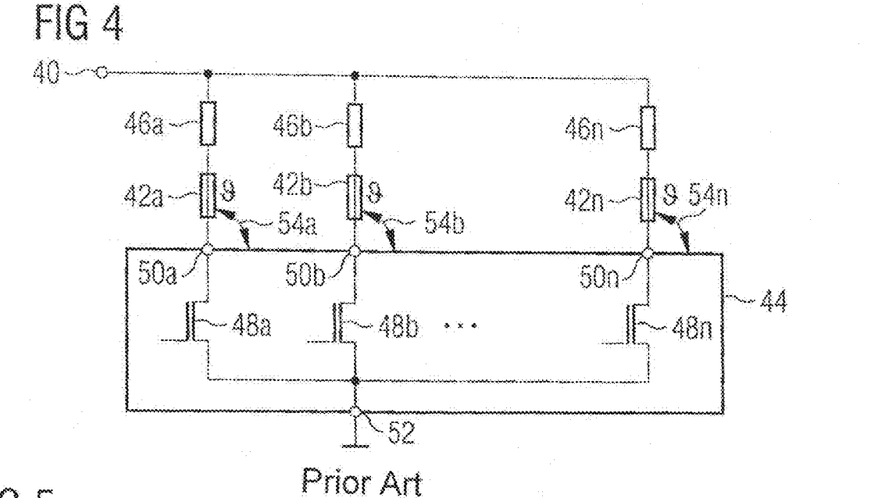
FIG. 4 shows a circuit for individually protecting several consumers in low-side configuration.

FIGS. 2, 3 and 4 show circuits for protecting electrical loads in high-side and low-side configurations, the same reference numerals being used below for those components which come up in FIGS. 1 to 4 and have identical functions. FIG. 2 shows supply voltage terminal 40, semiconductor switch 44, electrical loads 46a-46n, power switches 48a-48n within semiconductor switch 44, supply-voltage-side voltage terminal 50 of semiconductor switch 44, load-side voltage terminals 52a-52n of semiconductor switch 44, and several fuses 42a-42n. Voltage supply terminal 40 is directly connected to the supply-voltage-side voltage terminal 50 of semiconductor switch 44, power switches 48a-48n are connected, in semiconductor switch 44, between supply-voltage-side voltage terminal 50 and load-side voltage terminals 52a-52n. Initially, fuses 42a-42n, and subsequently, electrical loads 46a-46n are connected in series with one another between load-side voltage terminals 52a-52n and ground. Fuses 42a-42n are individually thermally coupled to power switches 48a-48n via thermally conductive connections 54a-54n. In arranging the fuse, as is shown here, in the load-side current path, and in thermally coupling fuse elements 42a-42n individually to power switches 48a-48n, channel-selective triggering of the fuses is achieved.

FIG. 3 shows the circuit diagram of a joint protection of several consumers in low-side configuration. What is shown are supply voltage terminal 40, fuse 42, semiconductor switch 44, electrical loads 46a-46n, and power switches 48a-48n. Electrical loads 46a-46n are connected between the common supply voltage terminal 40 and several load-side voltage terminals 50a-50n of semiconductor switch 44. Power switches 48a-48n are connected between the load-side voltage terminals 50a-50n of semiconductor switch 44 and a common ground-side voltage terminal 52 of semiconductor switch 44. Fuse 42 is connected between the common ground-side voltage terminal 52 of semiconductor switch 44 and ground, fuse 42 being thermally coupled to semiconductor switch 44 via thermally conductive connection 54. By means of the close thermal coupling, fuse 42 melts when a triggering temperature is exceeded if a malfunction is present in semiconductor switch 44, and all electrical loads 46a-46n are commonly disconnected from the current.

FIG. 4 shows a circuit for individually protecting several electrical loads in low-side configuration. What is shown are supply voltage terminal 40, fuses 42a-42n, semiconductor switch 44, electrical loads 46a-46n, and power switches 48a-48n. Initially, electrical loads 46a-46n and subsequently, fuses 42a-42n are connected in series between the common supply voltage terminal 40 and several load-side voltage terminals 50a-50n of semiconductor switch 44. Power switches 48a-48n are connected between the load-side voltage terminals 50a-50n of semiconductor switch 44 and the common ground-side voltage terminal 52 of semiconductor switch 44. Fuses 42a-42n are individually thermally coupled to power switches 48a-48n via thermally conductive connections 54a-54n. By means of the individual thermal coupling, the power switches 48a-48n are protected individually, so that in the event of a malfunction of one of switches 48a-48n and of the resulting triggering of the associated fuse, the switches not affected by the malfunction are not disconnected from supply voltage terminal 40, so that the remaining consumers can continue to be supplied with current. Thus what is done in the case of a risk of overheating is that the defective load current path is independently interrupted.

Figure 5:
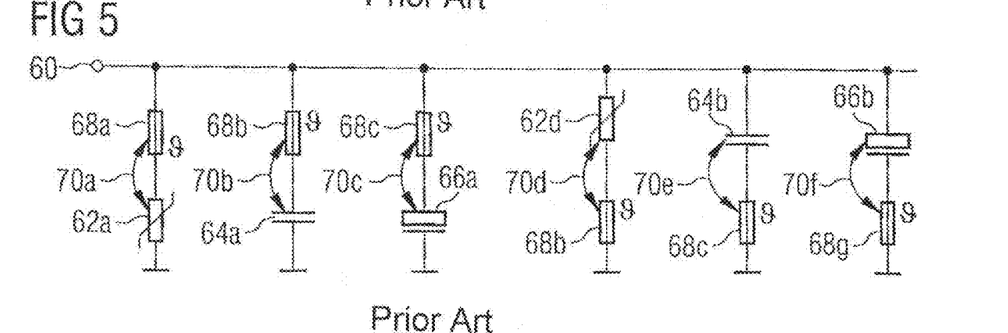
FIG. 5 shows a circuit for individually protecting several security-critical components directly connected to the supply voltage.

FIG. 5 shows several circuits for protecting security-critical devices directly connected to a common supply voltage terminal 60. The figure shows the common supply voltage terminal 60, a first varistor 62a and a second varistor 62b, a first multi-layer ceramic capacitor 64a and a second multi-layer ceramic capacitor 64b, a first tantalum electrolytic capacitor 66a and a second tantalum electrolytic capacitor 66b, and six fuses 68a-68f. Fuse 68a is connected between supply voltage terminal 60 and first varistor 62a, varistor 62a being connected between fuse 68a and ground, and varistor 62a and fuse 68a being thermally coupled to each other via a thermally conductive connection 70a. Fuse 68b is connected between supply voltage 60 and first multi-layer ceramic capacitor 64a, multi-layer ceramic capacitor 64a being connected between fuse 68a and ground, and multi-layer ceramic capacitor 64a and fuse 68b being thermally coupled to one another via a thermally conductive connection 70b. Fuse 68c is connected between supply voltage terminal 60 and first tantalum electrolytic capacitor 66a, tantalum electrolytic capacitor 66a being connected between fuse 68c and ground, and tantalum electrolytic capacitor 66a and fuse 68c being thermally coupled to one another via a thermally conductive connection 70c. Second varistor 62b is connected between supply voltage terminal 60 and fuse 68d, fuse 68d being connected between varistor 62b and ground, and varistor 62b and fuse 68d being thermally coupled to one another via a thermally conductive connection 70d. Multi-layer ceramic capacitor 64b is connected between fuse 68e and supply voltage terminal 60, fuse 68e being connected between multi-layer ceramic capacitor 64b and ground, and multi-layer ceramic capacitor 64b and fuse 68e being thermally coupled to one another via a thermally conductive connection 70e. Second tantalum electrolytic capacitor 66b is connected between supply voltage terminal 60 and fuse 68f, fuse 68f being connected between tantalum electrolytic capacitor 66b and ground, and tantalum electrolytic capacitor 66b and fuse 68f being thermally coupled to one another via a thermally conductive connection 70f. By means of the circuit shown and the respectively individual thermal coupling of the components, varistors 62a and 62b, multi-layer ceramic capacitors 64a and 64b, and tantalum electrolytic capacitors 66a and 66b may be individually protected against malfunction.

Figure 6:
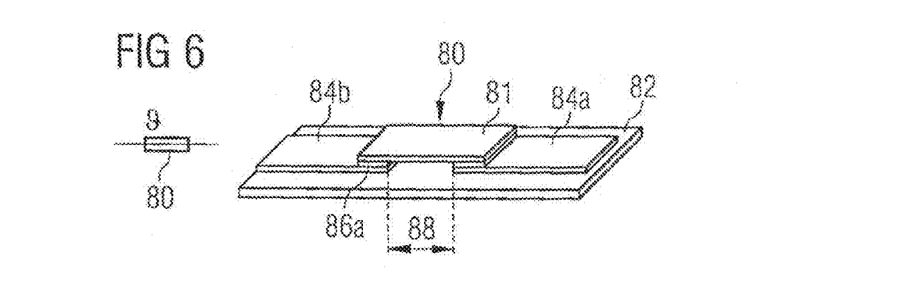
FIG. 6 shows a fuse for being used in a protection circuit.

FIG. 6 shows an embodiment of a fuse element as is employed in the circuit, the fuse element being generally designated by 80 below. What is shown are the fuse element 80, which includes a fusible material 81, a circuit carrier 82, a conductor line 84a and a conductor line 84b, and first and second pads 86a and 86b. Conductor lines 84a and 84b are arranged on a common circuit carrier 82, e.g. a circuit board made from FR-4. A gap 88 between conductor line 84a and conductor line 84b is conductively bridged by fuse element 80. To this end, fuse element 80 is connected, at first pad 86a, to conductor line 84a by means of soldering, use of a conductive adhesive or welding, and is connected, on second pad 86b, to conductor line 84b by means of soldering, use of a conductive adhesive or welding. When the triggering temperature, i.e. the melting temperature of fusible material 81, is exceeded, fusible material 81 of fuse element 80 melts and thereby interrupts the electrically conducting connection between conductor line 84a and conductor line 84b, so that the molten fusible material 81 fully or partially exposes gap 88, and so that fusible material 81 accumulates on pads 86a and 86b due to its surface tension.

In an configuration of fuse element 80, same is formed, as a molding, from a metallic alloy, and as such is stamped out, as a stamping, from a metal foil, or is cut off as a cutoff of a metallic foil tape. The metallic alloy has, for example, a eutectic melting point at a temperature in the range from 260° C. to 390° C. Examples of feasible alloys are as follows:

| Alloy | Melting point [° C.] |
|---|---|
| 82.6 Cd, 17.4 Zn | 266 |
| 80 Au, 20 Sn | 280 |
| 97.5 Pb, 2.5 Ag | 303 |
| 97.5 Pb, 1.5 Ag, 1 Sn | 309 |
| 92 Pb, 5 Sn, 2 Ag | 296 |
| 88 Au, 12 Ge | 356 |
| 96.4 Au, 3.6 Si | 370 |
| 95 Zn, 5 Al | 382 |

In an embodiment of the fuse element, fusible material 81 exhibits high surface tension, so that fusible material 81 contracts to form individual islands after it has melted, and so that disconnection of fuse 80 is ensured. In the case of a solder connection of fuse element 80 on pads 86a and 86b, the temperature of the soldering process is to be selected such that the fusible material 81 does not melt during the mounting process. Conversely, the alloy of the fusible material 81 may be selected such that fuse element 80 comes out of the soldering process of the assembly without any damage. In an configuration of the present fuse element 80, fuse element 80 exhibits a small "span" 88 so as to ensure high stress-cycle stability.

Figure 7:
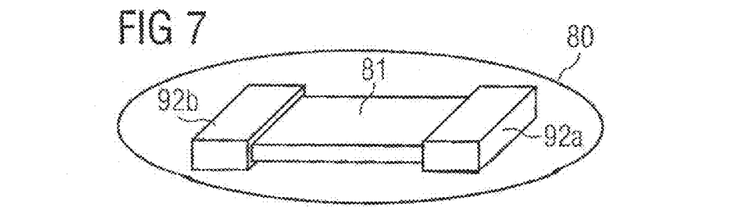
FIG. 7 shows a fuse as an SMD component for being used in a protection circuit.

In accordance with a further embodiment of fuse element 80 in FIG. 7, fuse element 80 includes a body of fusible material 81 made of an alloy which melts at the desired triggering temperature, the body being provided, on the contact areas, with a solderable metal layer 92a and 92b serving as a diffuse barrier. Metal layers, or barrier layers, 92a and 92b avoid the formation of a composite alloy and/or the formation of inter-metallic phases between the alloy of fusible material 81 and the alloy of the solder used while the fuse element 80 is soldered onto a circuit carrier. The geometric extension of fuse element 80 in FIG. 7 is compatible with standard SMD designs and therefore with standard SMD production processes. Barrier layers 92a and 92b may be, e.g., electro-deposited onto the body of fuse element 80, or may be pressed and/or rolled onto body 81 as terminal caps.

Figure 8:
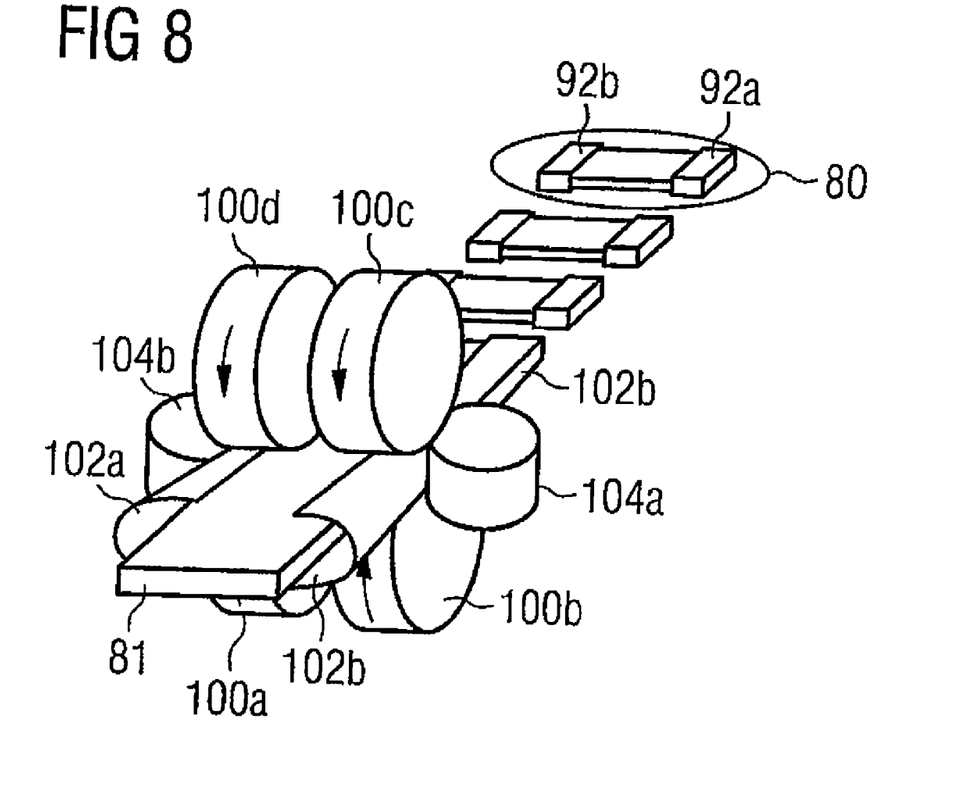
FIG. 8 shows an apparatus for producing the discrete fuse of FIG. 7.

FIG. 8 shows a possibility of manufacturing a fuse element 80, as is shown in FIG. 7, at low cost on an industrial scale. What is shown are the finished fuse element 80, a metal foil tape made of fusible material 81 of fuse element 80, four vertical drums 100a-100d, two foil strips 102a and 102b consisting of the material of barrier layers 92a and 92b, and two horizontal drums 104a and 104b. As may be seen in FIG. 8, the terminal caps and/or barrier layers 92a and 92b, which act as a diffuse barrier, are manufactured by rolling the foil strips 102a and 102b onto the tape-shaped fusible material 81 by means of horizontal drums 104a and 104b and of vertical drums 100a-100d. After passing through the drum arrangement, the tape-shaped material is separated into discrete fuse elements 80 by cutting or stamping, these fuse elements 80 preferably being compatible with standard SMT processes in terms of their geometric dimensions.

Figure 9:
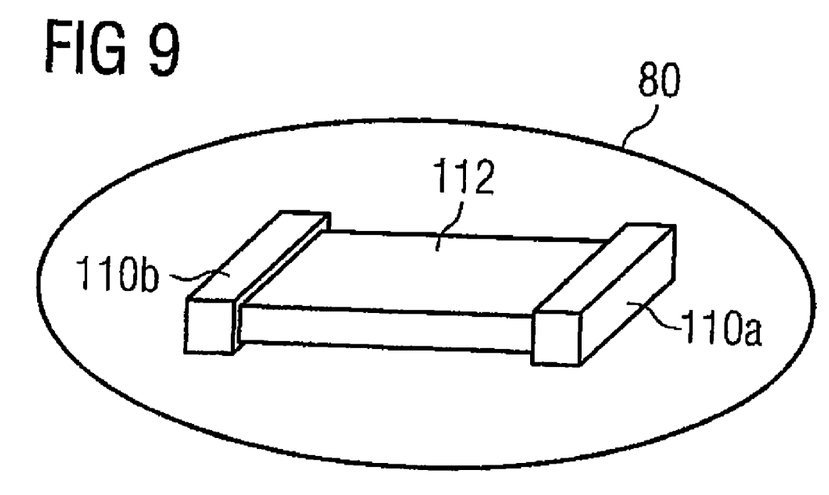
FIG. 9 shows a fuse with a protective layer covering the melting material.

FIG. 9 depicts a fuse element as is used in the circuit, which is embodied as a discrete device. What is shown are terminal caps 110a and 110b consisting of solderable and/or diffusion-inhibiting material. In the specific embodiment in FIG. 9, the body of fusible material is coated with a flux 112 which additionally protects the fusible material of fuse 80 against oxidation. By means of this configuration, the lasting functionality of fuse element 80 is ensured by the protection from oxidation, on the one hand, and at the same time, the triggering behavior of fuse element 80 is improved, since the protective layer 112 acting as a flux accelerates flowing-off of the molten fusible material from the current-carrying area, and thus accelerates the triggering of fuse 80.

Figure 10:
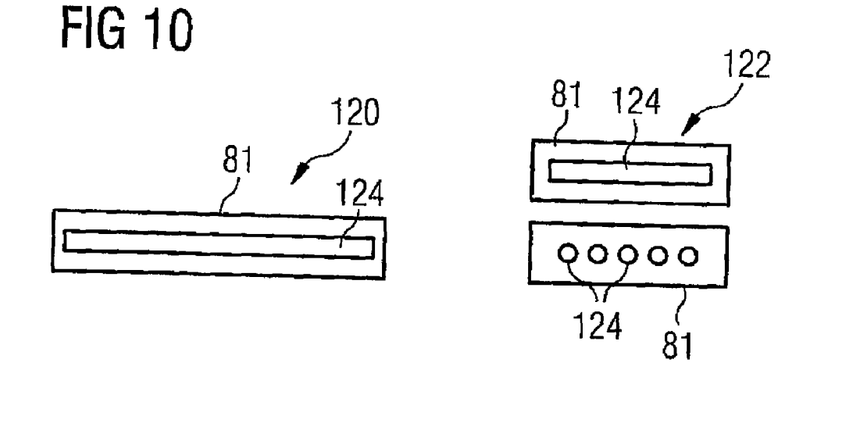
FIG. 10 shows a fuse with a flux integrated in the melting material.

Further possibilities of integrating a flux into the fuse element, and thus of improving the triggering behavior of the fuse, are depicted in FIG. 10. What is shown are a longitudinal section 120 through the fusible material 81 of the fuse element, and a cross-section 122 through the fusible material 81 of the fuse element. In the depicted embodiment of the fuse element, fusible material 81 of the fuse element includes one or more sealed cores 124 with a substance serving as the flux. The necessary sealing of the cores, so that the flux remains inside the fusible material 81, may be effected, for example, by a squeezing process during stamping or during cutting-off the fuse element from a wire/tape material.

Figure 11:
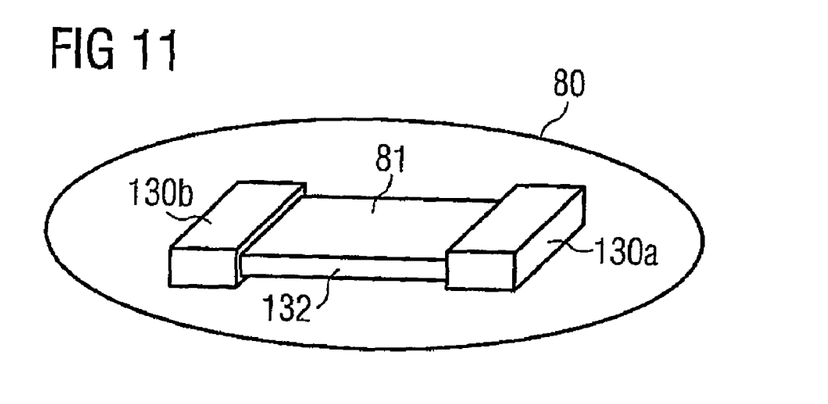
FIG. 11 shows a fuse as an SMD component with a ceramic carrier.

FIG. 11 shows a further embodiment of a fuse element 80 as a discrete component. What is shown are fusible material 81, terminal caps 130a and 130b as well as a ceramic carrier material 132. Fusible material 81 is deposited on the ceramic carrier material 132, e.g. in thin- or thick-layer technology, by means of electro-deposition, sputtering or by means of similar metallization processes. Terminal caps 130a and 130b are conductively connected to fusible material 81. The dimension of fuse element 80 is selected such that it may be utilized in an electronic circuit like a standard SMD device (e.g. a thin-layer resistor).

Figure 12:
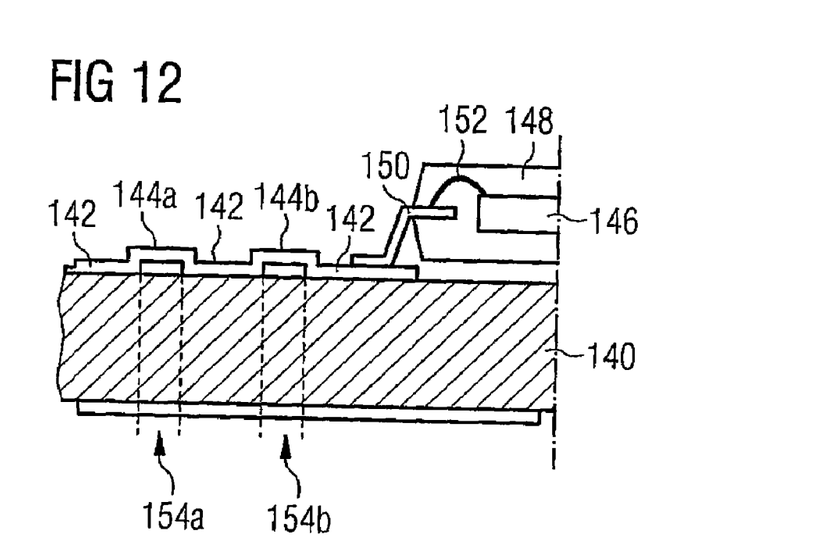
FIG. 12 shows a protection circuit with a fuse deposited directly onto a circuit carrier.

In one embodiment which is shown in FIG. 12, the fuse element is not implemented as a discrete device, but is deposited as a layer directly on a circuit carrier—e.g. a circuit board, hybrid ceramic, DCB substrate or the like. FIG. 12 shows a circuit carrier 140, a conductor line 142, a first fuse 144a and a second fuse 144b, a chip 146, a chip package 148, a terminal pin 150 and a bonding wire 152. Conductor line 142 is disconnected, or interrupted, at the locations of fuses 144a and 144b, a conductive connection being established between the portions of conductor line 142 by fuses 144a and 144b in that they bridge the gaps 154a and 154b created by the disconnection of the conductor line 142, fuses 144a and 144b being connected in an electrically conductive manner to conductor line 142 on each of their sides, respectively. Terminal pin 150 is conductively connected to conductor line 142, a current terminal of chip 146 within chip package 148 being conductively connected to terminal pin 150 by bonding wire 152. The layer of the melting material across gaps 154a and 154b may be deposited, during the production of circuit carrier 140 or of the conductor line, by means of thin- or thick-layer technology, a galvanic process, sputtering or similar metallization processes. In the embodiment, the thermal coupling of the chip 146 to be monitored to fuses 144a and 144b is effected by the proximity of fuses 144a and 144b to chip 146 and to chip package 148, and/or by the conductive connection of terminal pin 150 to conductor line 142, and thus to the fuse. In the event of a malfunction of chip 146, the dissipation heat generated is thus transferred to fuses 144a or 144b by means of thermal conduction, whereby the fuse material melts and flows off, e.g., into gaps 154a or 154b, or contracts on the two contact islands due to its surface tension, so as to interrupt the conductive connection, i.e. the current flow to chip 146.

Figure 13:
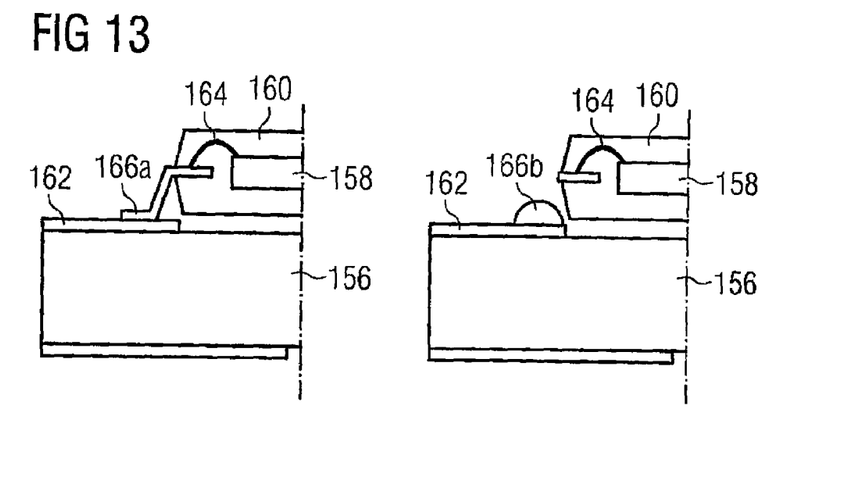
FIG. 13 shows a packaged power switch as an example of a current consumer with an integrated fuse.

A further embodiment is shown in FIG. 13. What is shown there are a circuit carrier 156, a chip 158, a chip package 160, a conductor line 162, a bonding wire 164 as well as an intact terminal pin 166a of the chip package 160 as well as a molten terminal pin 166b of chip package 160. In accordance with the embodiment which is shown here, the current-carrying terminal pins 166a and 166b, respectively, of the device, or chip 158 which is to be monitored and is located in chip package 160 and is connected to the terminal pin via bonding wire 164, consist of the melting material of the fuse. Depending on the protective effect desired, the melting material may consist of an alloy which melts between a temperature of, for example, 260° and 500° C., it also being possible for alloys melting at higher temperatures to be suitable because of the proximity to the heat source (to chip 158). In the embodiment shown here, it is preferred that not all terminal pins, or pins, of chip package 160 consist of the melting material. This ensures that chip 158 is kept in its position by chip package 160 even after the current-carrying terminal pins have melted, so that the current flow is reliably interrupted due to the molten terminal pin 166b.

Figure 14:
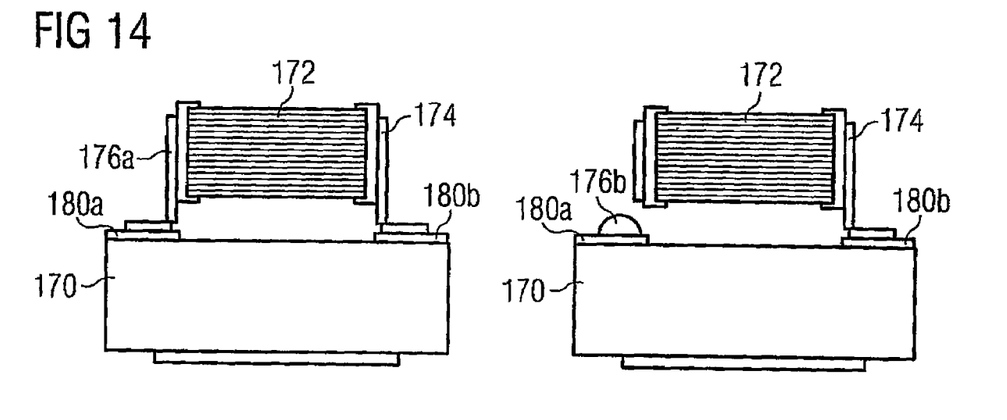
FIG. 14 shows a packaged component with an integrated fuse.

In FIG. 14, a further embodiment is depicted. FIG. 14 shows a circuit carrier 170, a multi-layer ceramic capacitor 172, a first terminal pin 174 as well as a second intact terminal pin 176a and a second molten terminal pin 176b. In the functional state, capacitor 172 is conductively connected to a conductor line at a first contact 180a by its first terminal pin 176a, and is connected to a second conductor line at a second terminal point 180b by its second terminal pin 174. The capacitor exhibits specially formed—e.g. L-shaped—terminal pins to ensure mechanical load reduction of the capacitor at thermal changes in length and bending stresses of circuit carrier 170. As is shown on the right-hand side of FIG. 14, in the event of the capacitor 172 overheating, the terminal pin 176b consisting of the melting material of the fuse will melt at contact point 180a, so that the current flow at contact point 180a is reliably interrupted. In this configuration, the component to be protected, such as capacitor 172, is protected both against thermal overload and against mechanical stress.

Figure 15:
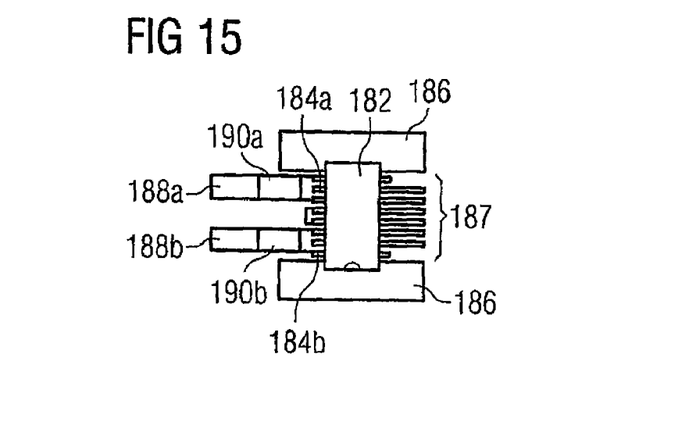
FIG. 15 shows a protection circuit for protecting a multi-channel power switch.

FIG. 15 shows an electric circuit. What is shown are a multi-channel semiconductor switch 182 located in a PDSO 20 package and having a first load output 184a, a second load output 184b, a supply voltage terminal 186 and a current terminal 187, it being possible for each of the terminals to consist of several discrete conductor lines. Load output 184a is connected to a conductor line 188a, and load output 184b is connected to a conductor line 188b, the conductor lines 188a and 188b being interrupted in direct proximity to the semiconductor switch 182, these interruptions being conductively bridged by fuse elements 190a and 190b. Good thermal coupling between fuses 190a and 190b and semiconductor switch 182 is ensured by fuses 190a and 190b, which are located as close to semiconductor switch 182 as possible, which is why the excessive heat evolution generated in the event of a defect in semiconductor switch 182 causes the fusible material of fuses 190a and 190b to melt, so that fuse elements 190a and 190b interrupt the current flow, and so that dangerous heat evolution is thereby stopped. In the arrangement shown, semiconductor switch 182 includes two separate switches, the fuse 190a being mounted spatially closer to the first switch, and fuse 190b being mounted closer to the second switch. This results in a closer thermal coupling of fuse 190a to the first switch, whereby the fuse selectively triggers, and whereby in the event of a malfunction of, e.g., the first switch, the second switch need not be disconnected from the current.

Figure 16:
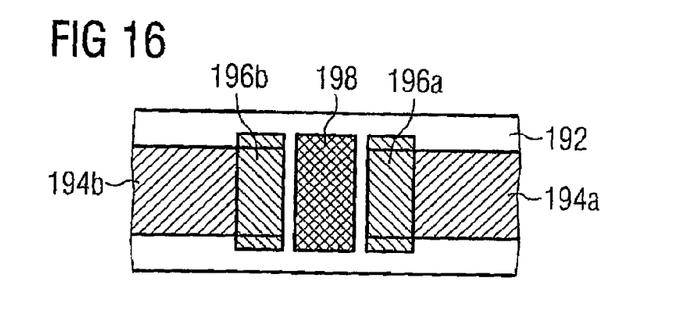
FIG. 16 shows a conductor-line arrangement for mounting a fuse in a protection circuit.

FIG. 16 shows a further embodiment, wherein a circuit carrier 192, a first conductor line 194a and a second conductor line 194b, a first contact field 196a and a second contact field 196b as well as a repelling field 198 are shown. First conductor line 194a ends in contact field 196a, at which a first one of 2 sides of a fuse element may be conductively connected, so that the non-conducting gap between contact field 196a and contact field 196b is fully bridged by the melting material of the fuse, the fuse being conductively connected, with a second side, to contact pad 196b. This ensures, in the non-molten state of the fusible material, that current may flow from conductor line 194a to conductor line 194b. The repelling field 198 located between first contact pad 196a and second contact pad 196b is coated with a solder-stop resist having the property of repelling the molten fusible material of the fuse, so that the molten fusible material cannot remain in the area of the repelling field 198 after melting, and so that reliable and fast disconnection of the fuse is thereby ensured. The solder-stop resist thus assists the disconnecting of the fuse due to its solder-repellant properties.

Figure 17:
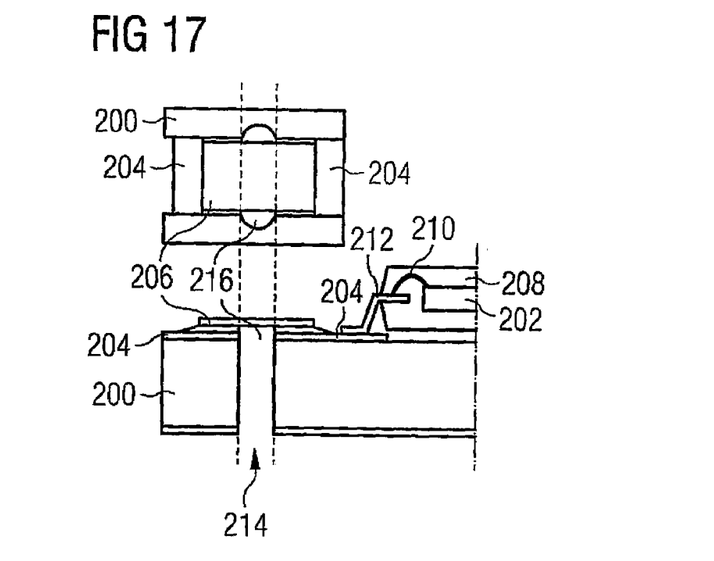
FIG. 17 shows a protection circuit, realized on a circuit carrier, with an apparatus for assisting the triggering of the fuse.
Figure 18:
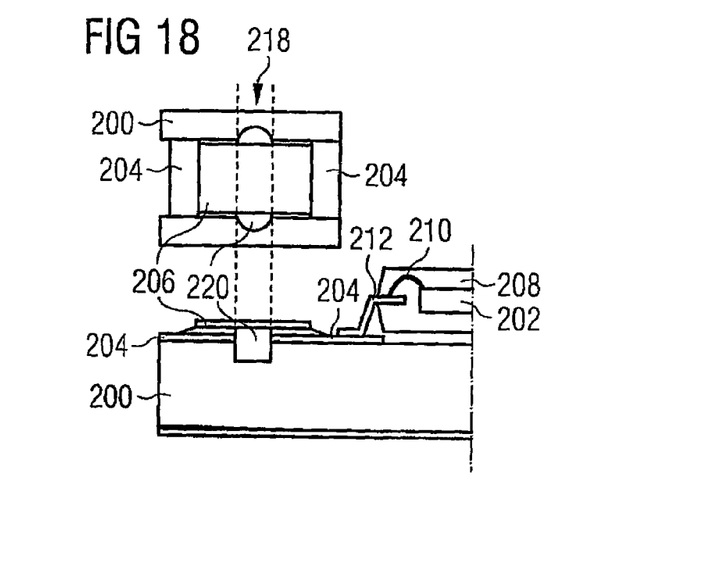
FIG. 18 shows a fuse and current-consumer switch-off carrier with a suitable mechanical assistance device for accelerating the triggering of the fuse.
Figure 19:
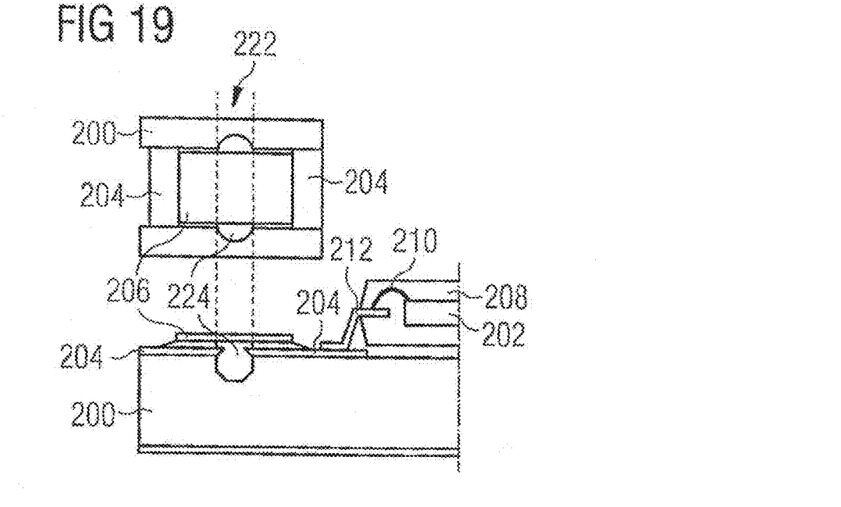
FIG. 19 shows a fuse and a current consumer on a common circuit carrier with additional assistance material which accelerates the triggering of the fuse.

FIGS. 17 to 19 describe further embodiments, wherein disconnection of the fuse is accelerated by suitable measures, which is why FIGS. 17 to 19 will be described jointly below, and which is why the individual figures will be dealt with individually only if they differ from the common features of all figures. FIGS. 17 to 19 depict cross-section-like representations of embodiments as well as plan views of the embodiments for part of the cross-section-like representations, respectively. What is depicted in each case are a circuit carrier 200, a device and/or a chip 202 to be monitored, a conductor line 204 carrying the supply current, and a fuse element 206. Chip 202 is located within a chip package 208, its current terminal being connected to a terminal pin 212 of chip package 208 via a conductive connection 210. Conductor line 204 is interrupted in direct proximity to terminal pin 212, the interruption being conductively bridged by fuse element 206. In the area of fuse element 206, suitable measures are taken in each case to assist the removal of the fusible material, the individual measures being discussed below with reference to FIGS. 17 to 19.

In FIG. 17, a recess 216 is located in circuit carrier 200, such as a milling or stamping slit, in an area 214 below fuse element 206, recess 216 extending across the entire thickness of circuit carrier 200, which means that recess 216 generates a hole in circuit carrier 200. This slit, or this recess, assists the disconnection of the fuse, since the molten fuse material may flow off into the gap in the entire area 214, so that the conductive connection is interrupted across the entire width of area 214. This increases the width of the contact disconnection distance at the fuse element triggered, so that with increased voltages applied at conductor line 204, the risk of an arc is reduced. The disconnection of the fuse is assisted independently of the component to be monitored, i.e. the component to be monitored may be a power semiconductor device or a different safety-critical passive device.

In FIG. 18, the triggering of the fuse in a well area 218 which is located underneath fuse element 206 and which has a depression 220 formed in the circuit carrier 200 is assisted. By depression 220 in circuit carrier 200, the flowing-off of the molten fusible material is also assisted, for example by capillary action, a smaller mechanical destabilization of circuit carrier 200 taking place here than in the embodiment of FIG. 17, where circuit carrier 200 is interrupted in its entire thickness by gap 216. With multi-layer circuit boards, this variant may have the additional advantage that layers of the circuit board which are located underneath the fuse element are not blocked for the layout.

In the embodiment shown in FIG. 19, a volume 224 is recessed from the circuit carrier in an area 222 underneath fuse element 206, so that volume 224 is limited by circuit carrier 200 and fuse element 206. Volume 224 is filled with a bulging material or an explosive. The explosive is set off by the fusible material entering into volume 224 when the fusible material begins to melt, so that the overpressure caused by the explosive being set off discharges through fuse element 206, and so that the fusible material which has fully or partially molten is thereby removed from area 222 in a fast and complete manner. In the event of a bulging material in volume 224, care is to be taken to ensure that volume 224 is completely limited by circuit carrier 200 and fuse element 206, so that the overpressure generated in volume 224 by the bulging material cannot escape through any leak. When the fusible material starts to melt, the fusible material of fuse element 206 will soften, so that it starts to deform under the influence of the overpressure of the bulging material. Once the material is soft enough, there will be an abrupt interruption of the electrically conducting connection, similar to the setting-off of the explosive, i.e. the disconnection of the fuse is also accelerated. In an configuration, the bulging material is not gaseous, but consists of a highly swellable material, which significantly eases processing. Volume 224 may also be filled with a flux so as to accelerate the triggering of the fuse.

In FIGS. 20 and 21 and/or in the further embodiments, the electric circuit is shown with a power switch and varistors and/or capacitors or cable terminals as devices to be protected. This is an exemplary application of the circuit—any other devices which lead to a large amount of heat evolution in the event of a malfunction may be protected.

FIGS. 1 to 4 depict that, by means of external wiring, the fuse elements are connected to a semiconductor switch and thermally coupled thereto. In a further embodiment, the fuse elements may also be integrated into the package of semiconductor switch 44 and there be thermally coupled directly to the individual power switches 48a-48n. Thermal coupling may also be configured, for example, in a particularly efficient manner by means of a heatpipe or a phase plane.

While the embodiments show the individual protecting of individual components, it is also possible to combine several components into one group and to protect it by the circuit, depending on the security requirements.

The embodiments indicate exemplary alloys with melting points in the range from 260°-390° C. Depending on the circumstances, any other metallic or non-metallic material which is conductive in the envisaged temperature range may be used as a fuse element, it being possible to adjust the geometry of the circuit, with regard to the heat transfer properties and the desired triggering temperature of the fuse, to the individual requirements of the problems concerned in nearly any manner desired.

The methods for conductively connecting the fuse element to a conductor line or to other conductive components which are given as examples are soldering, use of a conductive adhesive or welding, any other method of establishing a conductive connection also being possible, such as folding, riveting or crimping, so as to connect a fuse element to a circuit carrier.

The various possibilities of accelerating the disconnection of the fuse elements are depicted in FIGS. 16 to 19 using examples wherein the fuse element is directly mounted on a circuit carrier. In the same manner, the same methods for accelerating the triggering of the fuse may be integrated for discretely manufactured fuse elements as are depicted, for example, in FIG. 11. In FIG. 11, for example, it is possible to mount a volume filled with explosives in the ceramic carrier material 132, as was explained with reference to FIG. 19.

While the circuit principle is represented using a semiconductor switch and a PDSO-20 package in FIG. 15, it may also be implemented in this manner for any other type of package which may be mounted on a circuit board such as Power SO-10, TO-263, 1206. In the embodiment in FIG. 15, protection is also possible by arranging fuse elements 190a and 190b in the common supply feedline 186.

The assisting means, depicted in FIG. 16, for assisting the disconnection process of the fuse by means of a solder-stop resist deposited in an area underneath the fusible material, may also be implemented using other materials which are metallophobic and/or have the property of repelling the molten material of the fuse. This may also be a solder-stop resist which is subsequently poured over the fuse element once it has been assembled.

In one embodiment which is shown in FIG. 13, the circuit is configured such that the current consumer is mounted in a package, and that the current-carrying terminal pin of the package consists of the melting material of the fuse. This principle may be extended to cover any other types of package which may be mounted on circuit boards—in particular, in a further modification, the current-carrying terminal pins of a lead frame are manufactured from the melting material of the fuse, so that a multiplicity of different chips may be protected by means of the normal production process, wherein a chip is conductively connected to the lead frame, when a lead frame having terminal pins made from the fusible material is used.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A discrete fuse element for protecting a current consumer, comprising:
   a first terminal point;
   a second terminal point;
   a fusible material, which melts at a predetermined temperature, between the first and the second terminal points, which is configured to establish, in the non-molten state, an electrically conductive connection between the first and the second terminal points; and
   an assisting means between the first and the second terminal points, configured to assist in removing the fusible material in the molten state from an area between the first and the second terminal points, wherein the fusible material is deposited on a surface of a carrier, and the assisting means includes a layer of solder stop resist which exhibits a property of repelling the fusible material.

2. A fuse element according to claim 1, wherein the assisting means is configured to exert a force, onto the molten fusible material, dimensioned such that the fusible material is not moved in the non-molten state, and is moved out of the area in the molten state.

3. A fuse element according to claim 1, wherein the assisting means comprises an assistance material which is in contact with the fusible material and reduces a viscosity of the fusible material once the fusible material has melted.

4. A fuse element according to claim 3, wherein the assisting means comprises a flux arranged on the fusible material of the fuse, the flux being embodied such that a flowing-off of the fusible material in the molten state is accelerated.

5. A fuse element according to claim 3, wherein the assisting means comprises one or more cores of a flux which are arranged within the fusible material of the fuse element, the flux being embodied such that a flowing-off of the fusible material in the molten state is accelerated.

6. A fuse element according to claim 5, wherein the carrier comprises several layers, and the surface of the carrier is formed of a layer repelling the fusible material.

7. A fuse element according to claim 1, wherein the first and the second terminals are mechanically connected to a carrier material located between the first and second terminals, the assisting means comprising a gap or a depression in the carrier material in the area of the fuse element, the fusible material covering the gap or the depression such that a free volume, which is not filled with the carrier material or the fusible material of the fuse, is formed in the carrier material in the area of the fuse.

8. A fuse element according to claim 7, wherein in the area of the fusible material, a depression in the carrier material is covered by the fusible material, so that a volume is limited by the carrier material and the fusible material, the volume being filled with a bulging material or an explosive.

9. A fuse element according to claim 7, which comprises an oblong carrier of the shape of a rectangular parallelepiped, on the first longitudinal side of which a first metallization is embodied as a first terminal point, and on the second longitudinal side of which a second metallization is embodied as a second terminal point, the assisting means being formed by the carrier, and the fusible material being arranged between the first and second metallizations on the carrier.

10. A fuse element according to claim 1, wherein the fusible material exhibits a melting temperature of between 200° C. and 500° C.

11. A fuse element according to claim 1, wherein the fusible material consists of a metallic alloy.

12. A fuse element according to claim 1, wherein the fusible material is an element selected from the group consisting of:

| Alloy | Melting point [° C.] |
|---|---|
| 82.6 Cd, 17.4 Zn | 266, |
| 80 Au, 20 Sn | 280, |
| 97.5 Pb, 2.5 Ag | 303, |
| 97.5 Pb, 1.5 Ag, 1 Sn | 309, |
| 92 Pb, 5 Sn, 2 Ag | 296, |
| 88 Au, 12 Ce | 356, |
| 96.4 Au, 3.6 Si | 370, and |
| 95 Zn, 5 Al | 382. |

13. A method for protecting a current consumer, comprising:
   providing a fuse element comprising a first terminal point, a second terminal point, and a fusible material, which melts at a predetermined temperature, between the first and the second terminal points, which is configured to establish, in the non-molten state, an electrically conductive connection between the first and the second terminal points; and
   providing an assisting means between the first and the second terminal points, configured to assist in removing the fusible material in the molten state from an area between the first and the second terminal points, wherein the fusible material is deposited on a surface of a carrier, and the assisting means includes a layer of solder stop resist which exhibits a property of repelling the fusible material.

14. A method according to claim 13, wherein the assisting means is configured to exert a force, onto the molten fusible material, dimensioned such that the fusible material is not moved in the non-molten state, and is moved out of the area in the molten state.

15. A method according to claim 13, wherein the assisting means comprises an assistance material which is in contact with the fusible material and reduces a viscosity of the fusible material once the fusible material has melted.

16. A method according to claim 13, wherein the first and the second terminals are mechanically connected to a carrier material located between the first and second terminals, the assisting means comprising a gap or a depression in the carrier material in the area of the fuse element, the fusible material covering the gap or the depression such that a free volume, which is not filled with the carrier material or the fusible material of the fuse, is formed in the carrier material in the area of the fuse.

17. A method according to claim 13, wherein the fusible material exhibits a melting temperature of between 200° C. and 500° C.

18. A method according to claim 13, wherein the fusible material consists of a metallic alloy.

19. A method according to claim 13, wherein the fusible material is an element selected from the group consisting of:

| Alloy | Melting point [° C.] |
|---|---|
| 82.6 Cd, 17.4 Zn | 266, |
| 80 Au, 20 Sn | 280, |
| 97.5 Pb, 2.5 Ag | 303, |
| 97.5 Pb, 1.5 Ag, 1 Sn | 309, |
| 92 Pb, 5 Sn, 2 Ag | 296, |

-continued

| Alloy | Melting point [° C.] |
|---|---|
| 88 Au, 12 Ge | 356, |
| 96.4 Au, 3.6 Si | 370, and |
| 95 Zn, 5 Al | 382. |

20. A discrete fuse element for protecting a current consumer, comprising:
   a first terminal point;
   a second terminal point;
   a fusible material, which melts at a predetermined temperature, between the first and the second terminal points, which is configured to establish, in the non-molten state, an electrically conductive connection between the first and the second terminal points; and
   an assisting means between the first and the second terminal points, configured to assist in removing the fusible material in the molten state from an area between the first and the second terminal points, wherein the fusible material is deposited on a surface of a carrier, and the assisting means includes a layer of solder stop resist which exhibits a property of repelling the fusible material, wherein the assisting means comprises an assistance material which is in contact with the fusible material and reduces a viscosity of the fusible material once the fusible material has melted, and wherein the assisting means comprises a flux arranged on the fusible material of the fuse, the flux being embodied such that a flowing-off of the fusible material in the molten state is accelerated.

* * * * *

UNITED STATES PATENT AND TRADEMARK OFFICE
CERTIFICATE OF CORRECTION

PATENT NO. : 7,554,432 B2  
APPLICATION NO. : 11/420280  
DATED : March 24, 2009  
INVENTOR(S) : Alfons Graf et al.

It is certified that error appears in the above-identified patent and that said Letters Patent is hereby corrected as shown below:

Title page, item [73] Assignee: include --Fraunhofer-Gesellschaft zur Foerderung der angewandten Forschung e. V., Muenchen (DE)--

Signed and Sealed this

Eighth Day of September, 2009

David J. Kappos  
*Director of the United States Patent and Trademark Office*

UNITED STATES PATENT AND TRADEMARK OFFICE
CERTIFICATE OF CORRECTION

PATENT NO.         : 7,554,432 B2
APPLICATION NO.    : 11/420280
DATED              : June 30, 2009
INVENTOR(S)        : Alfons Graf et al.

Page 1 of 1

It is certified that error appears in the above-identified patent and that said Letters Patent is hereby corrected as shown below:

Column 16, claim 12, line 7 in the table; please replace "88 Au, 12 ce" with -- 88 Au, 12 Ge --

Signed and Sealed this

Thirteenth Day of October, 2009

David J. Kappos
*Director of the United States Patent and Trademark Office*